US012785620B2

(12) United States Patent
Ensle

(10) Patent No.: US 12,785,620 B2
(45) Date of Patent: Nov. 3, 2026

(54) HIGH POWER OSCILLATOR

(71) Applicant: Harold Ellis Ensle, Arvada, CO (US)

(72) Inventor: Harold Ellis Ensle, Arvada, CO (US)

( * ) Notice: Subject to any disclaimer, the term of this patent is extended or adjusted under 35 U.S.C. 154(b) by 0 days.

(21) Appl. No.: 18/892,963

(22) Filed: Sep. 23, 2024

(65) Prior Publication Data

US 2026/0088759 A1 Mar. 26, 2026

(51) Int. Cl.
*H03B 5/12* (2006.01)

(52) U.S. Cl.
CPC ......... *H03B 5/1206* (2013.01); *H03B 5/1231* (2013.01); *H03B 2200/0008* (2013.01)

(58) Field of Classification Search
CPC ... H03B 1/02; H03B 5/02; H03B 5/08; H03B 5/12; H03B 5/1203; H03B 5/1206; H03B 5/1221; H03B 5/1228; H03B 5/1231; H03B 5/1296
See application file for complete search history.

(56) References Cited

U.S. PATENT DOCUMENTS 2,751,497 A * 6/1956 Duncan .................. H03D 11/04 331/109
2,757,289 A * 7/1956 Har'el et al. ........ H03B 5/1231 331/117 R
2,983,879 A * 5/1961 Dodge ................... H03B 5/124 331/109
5,345,197 A * 9/1994 Riggio, Jr. ........... H03B 5/1296 331/173
5,748,051 A * 5/1998 Lewis .................. H03B 5/1203 331/177 V
8,830,007 B1 * 9/2014 Gamliel ............... H03B 5/1243 331/117 FE
9,712,031 B2 * 7/2017 Ensle ................... H02K 41/025
2021/0203187 A1 * 7/2021 Mishima ................ H02J 50/12

* cited by examiner

*Primary Examiner* — Levi Gannon

(57) ABSTRACT

An oscillator is proposed that can produce much greater voltage than the input voltage. To accomplish this, the coil and the capacitor in the tank circuit are connected in series. This creates a high voltage point between the capacitor and the coil. However, in order to work it requires a special feedback method. Like the Hartley and Armstrong oscillators, it draws energy from the coil in the tank circuit, except it is accomplished by a separate coil placed a given distance away from the coil in the tank circuit. Ultimately this oscillator has advantages when high power is needed. It has a small component count and is easy to build. Currently if one wants to have high power oscillation, one uses a low voltage signal generator and then goes through several steps to amplify the signal. Here the oscillator already produces the high voltage. Another advantage in the design is that since the feedback has to provide the right amount of energy, this can be adjusted to the optimal feedback by manually adjusting the distance between the coils. Another advantage is that, when aligning the coils correctly, the oscillator produces a virtually perfect sine wave.

2 Claims, 2 Drawing Sheets

HIGH POWER OSCILLATOR

BACKGROUND

The oscillator is one of the fundamental circuits in electronics. It is used to take a constant input voltage and convert it to an alternating current. This has many applications, a few examples being radio transmission, signal generation, radar, and sound synthesis. Many types of oscillators have been devised, though there are certain commonalities. An oscillator requires an amplifier and a component that determines the frequency. This is often provided by a circuit that contains a capacitor and a coil. It is called a tank circuit. When current is introduced into the tank circuit, there will be a tendency for the current to start oscillating at a particular frequency dependent on the capacitance and inductance in the circuit. This is called the resonant frequency. However, the resistance (or more precisely the impedance) will cause this oscillation to die out over time. Therefore a method is needed to feed back some of the power from the tank circuit to the amplifier so that the oscillations will be maintained. The three most common types of feedback are named in reference to their inventors. The Colpitts oscillator draws some energy from the capacitor by splitting it into two capacitors, the different capacitance between the two governing how much energy is fed back into the amplifier. The Hartley oscillator draws some energy from the coil by using a center tap, that essentially divides the coil into two coils, the location of the tap on the coil governing how much energy is fed back into the amplifier. The Armstrong oscillator also draws energy from the coil, but instead of a center tap it uses mutual inductance by having an addition coil wrapped around a common core of the coil in the tank circuit, thus behaving as a transformer. In this case, the number of winds in the secondary coil governs how much energy is fed back into the amplifier. The energy from the feedback has to be just right. If it is too little, there will not be enough signal for the amplifier to transfer enough power for the oscillation to be maintained. If the energy from the feedback is too great, then it loads the oscillator too much and the amplifier will not be able to maintain the oscillation. Concerning the tank circuit, the coil and capacitor are connected in parallel. This is done so that the amplifying transistor can be biased. The maximum output voltage of the tank circuit is the same as the input voltage on the transistor, thus the feedback energy maintains the correct ratio over a wide range of input voltages.

SUMMARY

The invention of the present application is an oscillator that can produce much greater voltage than the input voltage. To accomplish this, the coil and the capacitor in the tank circuit are connected in series. This creates a high voltage point between the capacitor and the coil. Having this type of tank circuit creates unique problems for the oscillator. Since the capacitor then blocks direct current, a single transistor amplifier cannot be properly biased and cannot be used in such a design. Instead a push-pull amplifier is used. However, the transistors in such an amplifier will not begin to conduct until a minimum voltage is reached thus the oscillator cannot trigger itself to start. However, if the transistor is biased in such a way as to eliminate cross-over distortion, then it can start automatically if the correct feedback is supplied. This brings up another problem. Because of the high voltage and its difference from the input voltage, the three previously described methods of feedback will not work, or at the very least will not work outside of a very specific single voltage. It is not even clear if this is possible as in experimental work it was never achieved. However, there is a feedback method that will work with good consistency over a range of voltages and frequencies. Like the Hartley and Armstrong oscillators, it draws energy from the coil in the tank circuit, except it is accomplished through mutual inductance by a separate coil placed a given distance away from the coil in the tank circuit. There are three critical parameters necessary for this feedback to work, the correct inductance in the feedback coil, the correct distance between the coils, and the correct resistance in the feedback circuit. Ultimately this oscillator has advantages when high power is needed. It has a small component count and is easy to build. Currently if one wants to have high power oscillation, one uses a low voltage signal generator and then goes through several steps to amplify the signal. Here the oscillator already produces the high voltage. Another advantage in the design is that since the feedback has to provide the right amount of energy, this can be adjusted to the optimal feedback by manually adjusting the distance between the coils. Another advantage is that, when aligning the coils correctly, the oscillator produces a virtually perfect sine wave.

DRAWINGS

DESCRIPTION OF THE ILLUSTRATIVE EMBODIMENT

Figure 1:
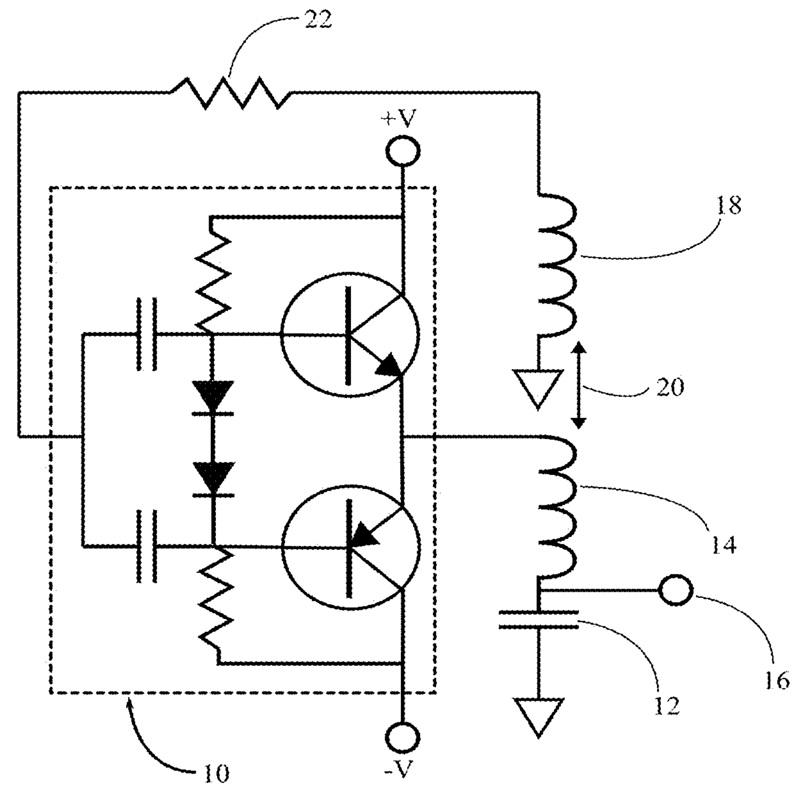
FIG. 1 is the illustrative embodiment of the basic oscillator circuit.

This embodiment (FIG. 1) is composed of an amplifier 10, a tank circuit composed of a coil 14 which will be designated as the tank coil, and a capacitor 12. It also includes an additional coil 18 which will be designated as the feedback coil that is placed a distance from the tank coil 14 indicated by the two headed arrow 20. On the feedback line there is a resistor 22. The tank circuit of the tank coil 14 and capacitor 12 has the high voltage output 16 drawn from between the coil 14 and capacitor 12.

Everything within the dotted line 10 is prior art and not related to the claims other than the fact that it is an amplifier. The amplifier 10 could be any type of push-pull amplifier where it has been biased to eliminate cross-over distortion. A particular illustration of this type of amplifier is given in the figure for two reasons. One is that single component amplifiers for the high voltages and currents typically employed are not common and one would build the amplifier from base components so that high power transistors could be selected, which then would be properly heat sinked and air cooled if need be. Two is that this particular amplifier design is known to work for the illustrative embodiment of the invention herein described.

The capacitance of the capacitor 12 and the inductance of the tank coil 14 establish the operating frequency of the oscillator. The three critical feedback components are the feedback coil 18, its distance 20 from the tank coil 14 and the resistor 22. In order for the oscillator to function each of these components must have the proper values. That is, the feedback coil 18 must have a correct inductance or more precisely, the inductance must fall within a certain range which depends on the inductance of the tank coil 14 and also the frequency of operation, the maximum output voltage, and the characteristics of the ferrite cores of the coils. These conditions also affect the correct choice of the distance between the coils 20 and the resistance of the resistor 22.

Because of these complexities, it is not obvious how to theoretically determine these three parameters. In fact it is virtually impossible to model this oscillator accurately with computer aided circuit design tools. Fortunately there is a fairly simple manual process to design and optimize this type of oscillator.

As a rule of thumb one should start with the resistor 22 having a resistance of 50 Ohms. If the output will be more than 300 mA, the resister 22 should be able to handle 10 W. This value will work in most situations. However, if the output will exceed 1 A. The resistance may need to be reduced even to the point of being removed entirely, but this also depends on the frequency and without some resistance on resistor 22, the oscillator will usually not work.

As a rule of thumb the feedback coil 18 should have an inductance 90%-100% of the inductance of the tank coil 14. It must never be greater than the inductance of the primary coil 14. Note that at some frequencies a larger inductance on the feedback coil 18 will not stop the oscillation, but the feedback inductance will end up governing the frequency of oscillation which can cause some confusion when designing the oscillator. At higher frequencies the initial choice of inductance needs to be adjusted as the above value will not work. As the frequency increases above 100 kHz, the inductance of the feedback coil needs to be reduced. By 400 kHz, the value should be about 50% of the inductance in the tank coil 14. By 1 MHz it should be at about 10%. Also at higher frequency, the success of the oscillator is more sensitive to the correct inductance of the feedback coil 18. So an optimizing process might require a feedback coil with a variable inductance which can be adjusted until the oscillation succeeds and that can be used to determine the right choice for the feedback coil 18.

Given the above selection process, one needs to consider the distance between the coils. As a rule of thumb one can start at 1 cm for the distance 20. This is between the ends of the coils, not the centers, so for example if the distance were zero, the cores of the two coils would be touching (which could occur). Now after the oscillation is established, the feedback coil 18 can be moved gradually away from the tank coil 14. What typically would be observed is as it is moved the amplitude of the output will increase until at a certain point the oscillation will fail. Thus the optimum distance is just before that occurs. The exact distances are also governed by the inductance in the feedback coil 18, so the process must be done for each design.

It has been assumed here that the two coils are aligned along their lengths which works the best. It is not absolutely required however. They can be placed in different orientations, but the above rules would no longer apply.

One additional note, the feedback has to be positive, so the coil has to be aligned and connected in the right direction. This is no serious problem for design as if there is any question, the connection can be reversed and tested for both cases.

Figure 2:
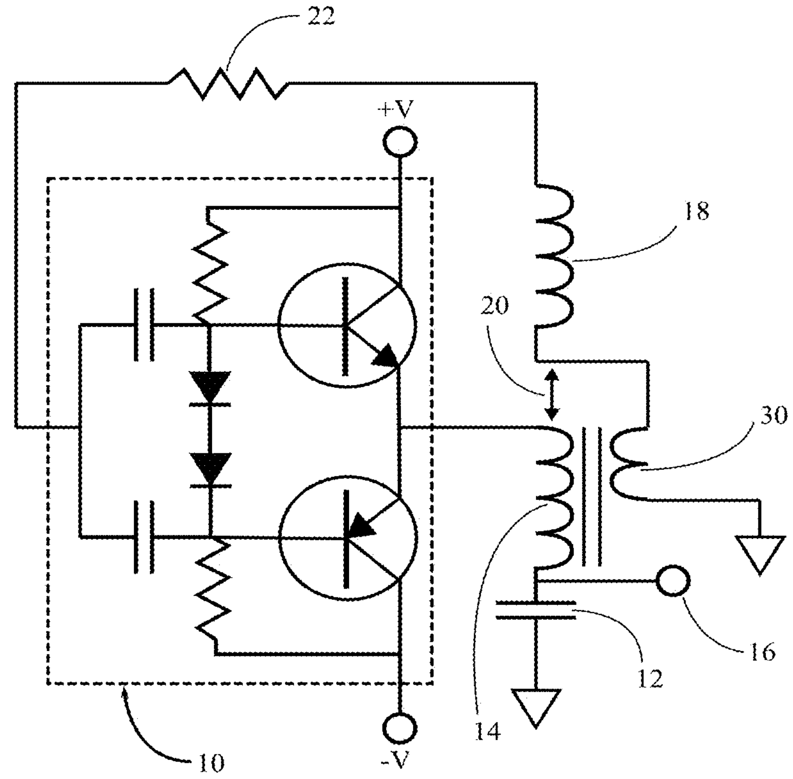
FIG. 2 is the embodiment with a small number of windings around the same core as the tank coil.

In FIG. 2 there is the same oscillator, except on the feedback line there are some windings directly around the tank coil 14. We will call this the trigger coil 30. The number can be anywhere between 0% and 10% of the number of windings in the tank coil 14. This coil is sometimes needed in particular situations. If the core of the tank coil 14 is not just a straight core, for example it is connected to additional ferrites that might create a loop to establish a magnetic current, then less flux is available to influence the feedback coil. The trigger coil then helps to supply the necessary feed back. The main feedback coil 18 is still required for the sake of the inductance. The trigger coil 30 is also needed with lower frequencies (<10 kHz) to provide the necessary feedback. Thus the circuit of FIG. 1 could be considered a special (but common) case of a more general embodiment of the invention in FIG. 2, where the number of trigger windings is zero. The actual number of windings in the trigger coil 30 depends on a number of factors. The more flux diverted into other ferrites, the more windings are needed. The lower the frequency, the more windings are needed.

Figure 3:
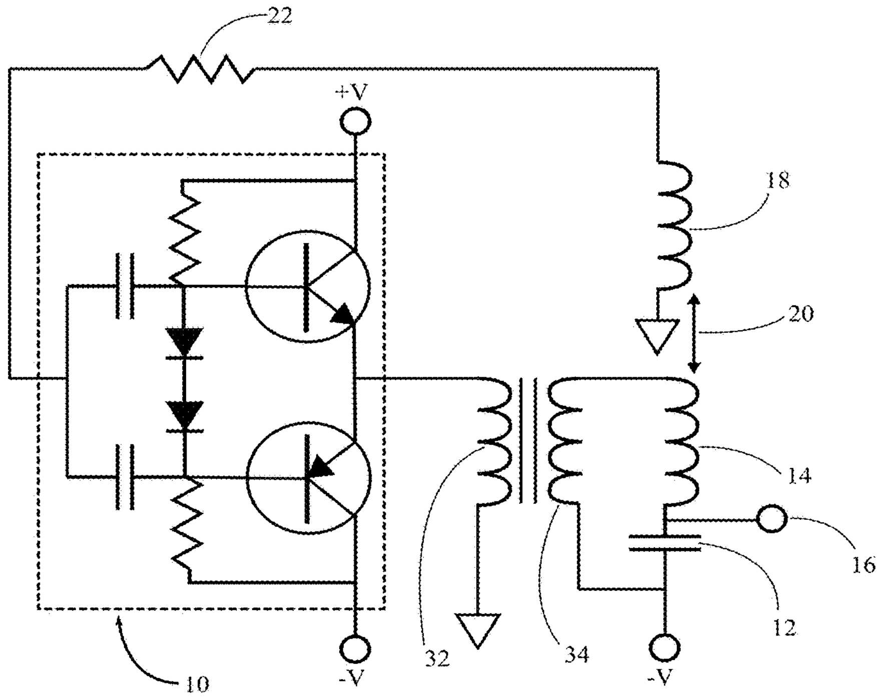
FIG. 3 is the enhanced embodiment where a transformer has been inserted to further amplify the voltage.

In FIG. 3 there is the same circuit, except a transformer with primary coil 32 and secondary coil 34 has been inserted between the amplifier 10 and the tank circuit containing capacitor 12 and coil 14. The feedback coil 18 is still placed next to the tank coil 14. This works essentially the same as the base circuit of FIG. 1. However, the transformer will amplify the voltage based on the turn ratio between the primary coil 32 and the secondary coil 34. The self inductance of the secondary coil 34 cannot be greater than the inductance of the tank coil 14, because the oscillations will fail. Also the inductance of the feedback coil 18 must be reduced based on the turn ratio in the transformer. The inductance would be reduced by approximately the same ratio.

To get an idea of the voltages that come out of this oscillator, we can imagine that the amplifier has a supply voltage of ±50V. It would be typical around 80 kHz to have 1.5 kV at the output 16 for the basic oscillator of FIG. 1 and FIG. 2. If in FIG. 3 the transformer had a turn ratio of 1:5, then one would have 7.5 kV at the output 16.

Figure 4:
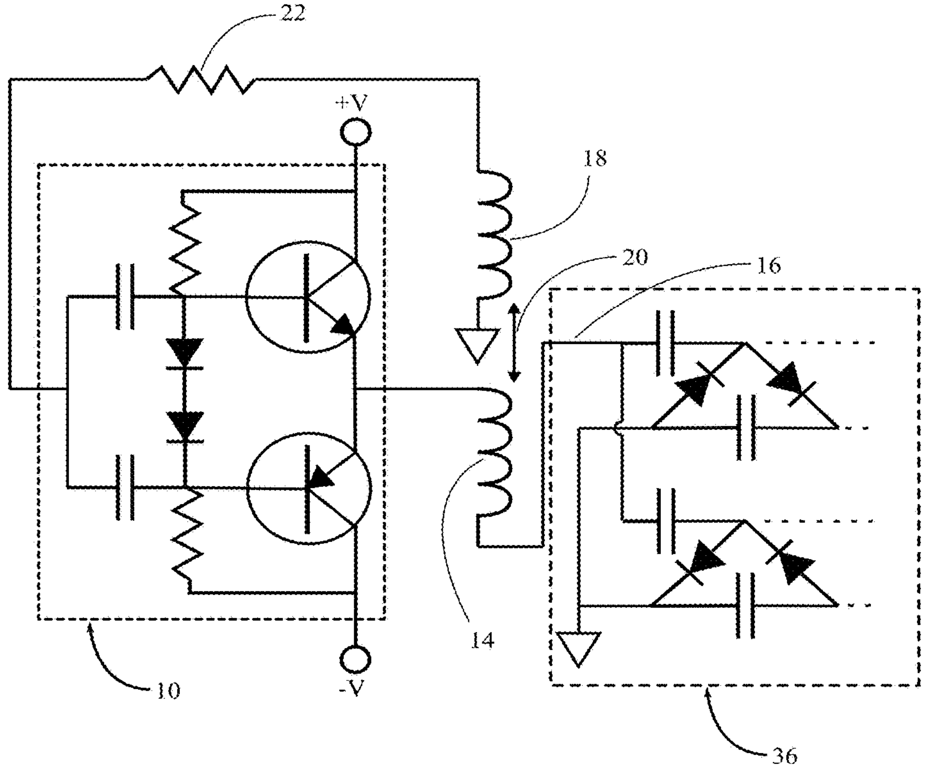
FIG. 4 is an example application where it is used to drive a voltage multiplier.

In FIG. 4 the oscillator is shown in a possible application where the capacitor 12 of the tank circuit has been replaced by the first stage of a voltage multiplier 36. The dotted lines drawn out of the circuit indicate that any number of stages could be used. This oscillator is advantageous in this application as it can easily establish a high voltage for the first stage in the voltage multiplier 36, so it requires fewer stages to obtain the desired voltage. Note that everything within the dotted lines of the voltage multiplier 36 is prior art.

To get an idea of the voltage in this case, given the 7.5 kV from the enhanced oscillator of FIG. 3 and imagining that the voltage multiplier had 10 stages, the output voltage would be 150 kV.

While an illustrative embodiment has been displayed and described, various modifications and substitutions may be made thereto without departing from the spirit and scope of the present invention. Accordingly, it is to be understood that the present invention has been described by way of illustration and not limitation.

The invention claimed is:

1. A circuit that converts direct current into alternating current comprising:

a. an electrical amplifying circuit, b. a tank circuit which contains a capacitor and a coil connected in series and connected to the output of said amplifying circuit, c. a feedback circuit which contains a coil placed near, but separate from the coil in said tank circuit wherein the coils do not form a transformer and where one line of the coil of said feedback circuit goes to ground and the other is connected to the input of said amplifying circuit where the coil in said feedback circuit provides feedback which is substantially caused by the mutual inductance between the coil in said tank circuit and the coil in said feedback circuit, d. a line connected to said tank circuit between said capacitor and the coil of of said tank circuit which leads to the output of said circuit, whereby said feedback circuit does not require a direct connection to the said tank circuit and the output voltage of said circuit can exceed the supply voltage of said circuit.

2. The circuit of claim 1 further including another coil which is wound around the same core as said coil of said tank circuit and is connected in series to said coil of said feedback circuit.

* * * * *